United States Patent [19]

Takebe et al.

[11] 4,380,825

[45] Apr. 19, 1983

[54] AUTOMATIC SWEEP DIGITAL TUNING CIRCUIT

[75] Inventors: Hideharu Takebe; Hiroshi Kobayashi, both of Itami, Japan

[73] Assignee: Mitsubishi Denki Kabushiki Kaisha, Tokyo, Japan

[21] Appl. No.: 299,502

[22] Filed: Sep. 4, 1981

[30] Foreign Application Priority Data

Sep. 9, 1980 [JP] Japan ................................. 55-125611
Sep. 9, 1980 [JP] Japan ................................. 55-125612

[51] Int. Cl.³ ............................................. H04B 1/26
[52] U.S. Cl. ..................................... 455/164; 455/182
[58] Field of Search ...................... 455/164, 182, 192; 358/193.1, 195.1

[56] References Cited

U.S. PATENT DOCUMENTS 3,936,753  2/1976  Clark ...................................... 455/164
4,217,552  8/1980  Mogi et al. ........................... 455/164

FOREIGN PATENT DOCUMENTS 54-51307  4/1979  Japan .................................... 455/164

Primary Examiner—Marc E. Bookbinder
Attorney, Agent, or Firm—Staas & Halsey

[57] ABSTRACT

An automatic sweep digital tuning circuit includes an up-down counter, a digital-to-analog converter, an electronic tuner, an automatic sweep control circuit and an automatic frequency fine control circuit. The up-down counter performs a count-up or count down operation under the control of the automatic sweep control circuit and the automatic frequency fine control circuit. The digital-to-analog converter converts the digital output of the up-down counter into a DC voltage. The electronic tuner receives the DC voltage and generates a tuning frequency. The automatic frequency fine control circuit finely controls the tuning frequency of the electronic tuner after the automatic frequency sweep by the automatic sweep control circuit has been stopped. A count down circuit forces the up-down counter to perform a count down operation to compensate for a time delay caused by the digital-to-analog conversion.

8 Claims, 7 Drawing Figures

AUTOMATIC SWEEP DIGITAL TUNING CIRCUIT

BACKGROUND OF THE INVENTION

FIELD OF THE INVENTION

This invention relates to an automatic sweep digital tuning circuit which may be used in television sets, and AM or FM radio receivers.

In one type of electronic tuner which has been extensively used in television sets and AM or FM radio receivers, a variable capacitance diode is employed as the capacitance of the tuning circuit and a tuning voltage is applied to the variable capacitance diode to produce resonance at a desired frequency. It should be noted that an electronic tuner which searches a desired broadcast station by automatically sweeping a tuning frequency (hereinafter referred to as "a search function") has been proposed. The tuning frequency is swept in accordance with a voltage synthesizer system in which the tuning voltage applied to the variable capacitance diode is processed as digital data.

The search function will be described below with reference to a conventional automatic sweep digital tuning circuit illustrated in FIG. 1. In FIG. 1, a switching circuit 1 applies a switching signal to an automatic sweep control circuit 2. The automatic sweep control circuit 2 provides a pulse to an up-down counter 3 in dependence upon the switching signal, thereby causing the up-down counter 3 to increase its count value. The up-down counter 3 supplies a digital output to a digital-to-analog (D/A) converter 4 which converts the digital output to an analog output comprising a DC voltage. The analog output is applied to an electronic tuner 5 as a tuning voltage for the variable capacitance diode. As the count value of the up-down counter 3 is increased, the tuning frequency of the electronic tuner 5 is swept from a low frequency to a high frequency. An automatic frequency fine control (AFC) circuit 6 provides fine control for tuning in the desired frequency.

When the tuning frequency is swept and approaches the frequency of a desired broadcast radio wave, the automatic sweep control circuit stops sending pulses to the up-down counter 3 and the sweep is suspended. FIG. 2 is a circuit diagram illustrating one example of a comparison circuit, incorporated in the automatic frequency fine control circuit 6 for determining when the sweep should be suspended. FIG. 3 illustrates waveform diagrams for illustrating the operation of the comparison circuit of FIG. 2.

Referring to FIG. 2, the comparison circuit comprises a pair of voltage comparators 11 and 12. An AFC voltage which varies as an S-shaped curve around a desired tuning point is applied to a terminal 13 by the electronic tuner 5 and reference voltages are applied to the voltage comparators 11 and 12 via input terminals 14 and 15, respectively. The outputs of the comparison circuits 11 and 12 are provided at terminals 16 and 17, respectively.

Referring to FIG. 3(a), reference voltages $V_1$ and $V_2$ are applied to the input terminals 14 and 15, respectively, and the AFC voltage (the solid line) is applied to the terminal 13. The reference voltages $V_1$ and $V_2$ are selected so as to meet the following expression:

$$V_1 > V_0 > V_2$$

where $V_0$ is the reference voltage of the AFC voltage. As can be seen from FIG. 3(b), the output of the voltage comparator 11 is at a low logic level (L) when the AFC voltage is lower than the reference voltage $V_1$ and is at a high logic level (H) when the AFC voltage is higher than the reference voltage $V_1$. In contrast, as seen in FIG. 3(c), the output of the voltage comparator 12 is at a low logic level (L) when the AFC voltage is higher than the reference voltage $V_2$ and is at a high logic level (H) when the AFC voltage is lower than the reference voltage $V_2$. Accordingly, referring to the S-shaped curve for the AFC voltage which is illustrated in FIG. 3(a), the output levels at the output terminals 16 and 17 are as indicated in FIGS. 3(b) and 3(c), respectively.

When the tuning frequency, which is being swept from a low frequency to a high frequency, approaches the frequency of the S-shaped curve of the AFC voltage, the output at the output terminal 16 is first raised to a high level (H) at the point A, and is then set to the low level (L) at the point B. The output at the output terminal 17 is raised to a high level (H) at the point D and if this high level at terminal 17 is detected to stop the sweep, then the tuning frequency at the time the sweep is stopped, is near point D on the S-shaped curve of the AFC voltage. The automatic frequency fine control circuit 6 is then operated to bring the tuning frequency to the optimum tuning point C.

An example of the remainder of the automatic frequency fine control circuit 6 and its connection to the up-down counter 3 is illustrated in FIG. 4. The automatic frequency fine control circuit 6 includes AND gates 18 and 19 and a pulse generating circuit 20. When the output at the output terminal 16 of the voltage comparator 11 is at the high level (H), the AND gate 18 is opened to apply the output pulses of the pulse generating circuit 20 to the up-down counter 3 so that the count value of the up-down counter 3 is increased. When the output at the output terminal 17 of the voltage comparator 12 is at the high level (H), the AND gate 19 is opened to apply the output pulses of the pulse generating circuit 20 to the up-down counter 3 so that the count value of the up-down counter 3 is decreased. Therefore, if the tuning frequency is between the frequencies represented by points A and E in FIG. 3(a), the automatic frequency fine control circuit 6 is capable of moving the tuning frequency to the optimum tuning point C.

One problem with the automatic sweep digital tuning circuit of FIG. 1 is that when the digital data of the up-down counter 3 is converted into an analog signal by the D/A converter 4, a time delay occurs. In addition, the response of the AFC voltage to the tuning frequency is delayed. Therefore, when the tuning frequency is swept from a low frequency to a high frequency and is stopped near the frequency of the broadcast radio wave (e.g., at the point D in FIG. 3(a)) as described above, the digital output of the up-down counter 3 is higher than a value corresponding to the analog output of the D/A converter 4 because of the above-mentioned time delay. Accordingly, if the automatic frequency fine control circuit 6 is operated under this condition, the DC voltage output of the D/A converter is initially shifted to a higher frequency. In general, for the S-shaped curve of the AFC voltage, the range of frequencies between points A and B is large, but the range of frequencies between points D and E is small. Thus, when the automatic frequency fine control circuit 6 is operated after the frequency sweep has been stopped, the tuning frequency is shifted to a point higher than point E, thereby making it impossible to bring the tuning frequency to the optimum tuning point C. This difficulty may be overcome by decreasing the sweeping speed; however, this results in a disadvantage in that the time required for sweeping the full range of frequencies which may be received, is increased.

SUMMARY OF THE INVENTION

It is an object of the present invention to provide an automatic sweep digital tuning circuit which overcomes the deficiencies of conventional automatic sweep digital tuning circuits.

In particular, it is an object of the present invention to provide an automatic sweep digital tuning circuit which is capable of detecting an optimum tuning frequency without having a corresponding increase in the sweeping speed.

These together with other objects and advantages, which will become subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENT

Figure 1:
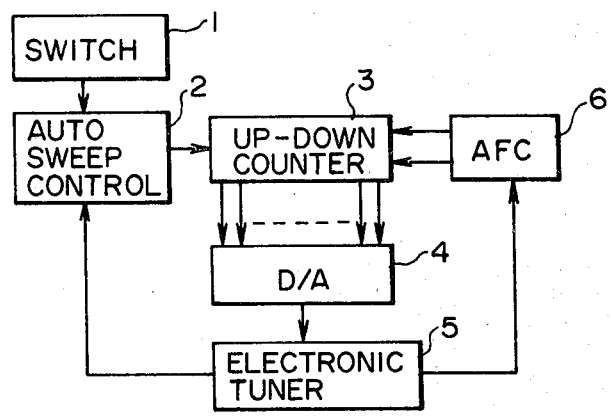
FIG. 1 is a block diagram of a conventional automatic sweep digital tuning circuit.
Figure 2:
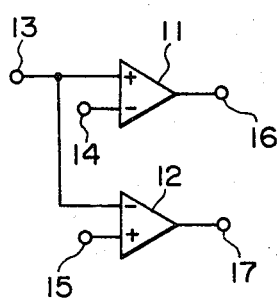
FIG. 2 is a circuit diagram illustrating one example of a comparison circuit for determining whether or not a tuning frequency is near the frequency of a desired broadcast radio wave.
Figure 5:
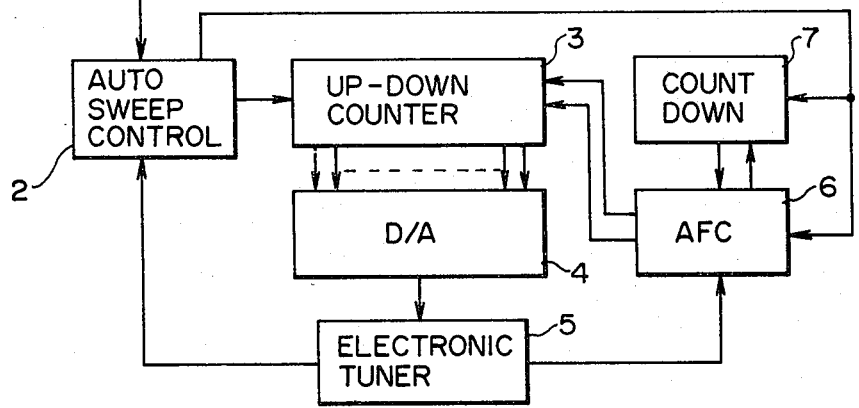
FIG. 5 is a block diagram of an embodiment of an automatic sweep digital tuning circuit in accordance with the present invention.

Referring to FIG. 5 which is a block diagram of an embodiment of an automatic sweep digital tuning circuit in accordance with the present invention, elements which are referred to by the same numerals as in FIG. 1 represent the same elements. The switching circuit 1 provides a signal for causing the automatic sweep control circuit 2 to start its automatic sweep operation. The up-down counter 3 receives a pulse signal from the automatic sweep control circuit 2 to increase or decrease its count value. The digital-to-analog converter 4 converts the digital output signal of the up-down counter 3 into an analog output signal which is a DC voltage. The DC voltage is applied, as at least one part of a tuning voltage, to the electronic tuner 5. The automatic sweep control circuit 2 causes the up-down counter 3 to perform a count-up operation in dependence upon the switching signal. The automatic sweep control circuit stops the count-up operation and then activates the automatic fine control circuit when the tuning frequency of the electronic tuning circuit 5 approaches a desired frequency to be received. After the count-up operation of the up-down counter 3 has been stopped, the automatic frequency fine control circuit 6 finely controls the tuning frequency of the electronic tuning circuit 5 to make it coincident with the desired frequency. A count down circuit 7 causes the up-down counter 3 to perform a count down operation for the time interval which elapses from the time that the automatic frequency fine control circuit 6 starts operation until the circuit 6 causes the up-down counter 3 to perform the count-up operation, after the automatic sweep of the tuning frequency by the automatic sweep control circuit 2 has been stopped.

Figure 3:
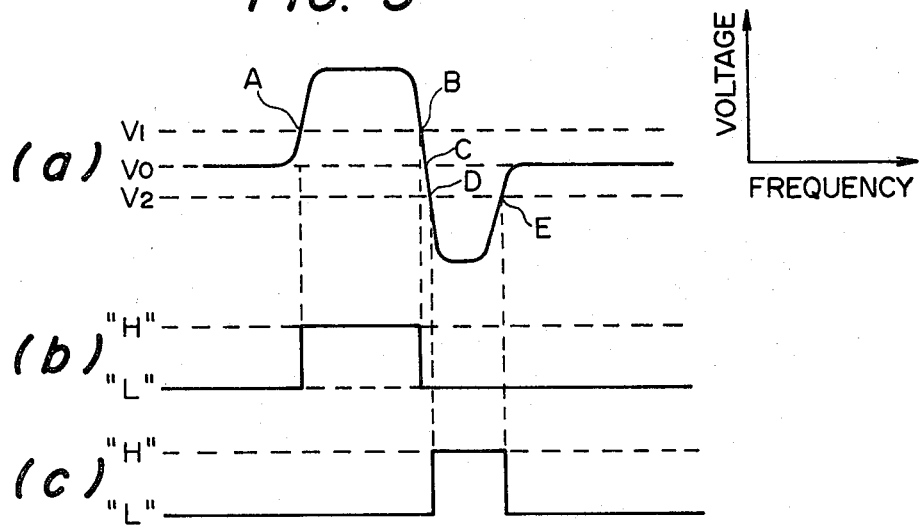
FIG. 3 illustrates signal waveforms for describing the operation of the circuit of FIG. 2.

In the automatic sweep digital tuning circuit of FIG. 5, count-up pulses are provided to the up-down counter 3 by the automatic sweep control circuit 2 under the control of the switching circuit 1, so that the up-down counter 3 performs a count-up operation. The digital output of the up-down counter 3 is converted into a DC voltage by the D/A converter 4 and the DC voltage is applied to a variable capacitance diode in the electronic tuner 5. Thus, the tuning frequency of the tuner 5 is swept towards a high frequency. When the tuning frequency comes to point D on the S-shaped curve of the AFC voltage (FIG. 3a) the sweep is stopped. At this point, the digital output of the up-down counter 3 has a value corresponding to a point higher in frequency than point D because of the time delay of the D/A conversion and the response delay of the AFC voltage. If the AFC circuit 6 operates to increase the digital output of the up-down counter 3, the tuning frequency is shifted to a point higher in frequency than point E and the AFC circuit 6 cannot bring the tuning frequency to the optimum tuning point C. Therefore, in order to bring the tuning frequency to the optimum point C, the count down circuit 7 is employed.

Figure 4:
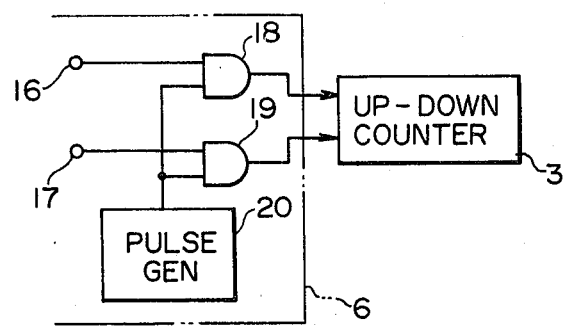
FIG. 4 is a circuit diagram illustrating an example of part of the automatic frequency fine control circuit 6 of FIG. 1.
Figure 6:
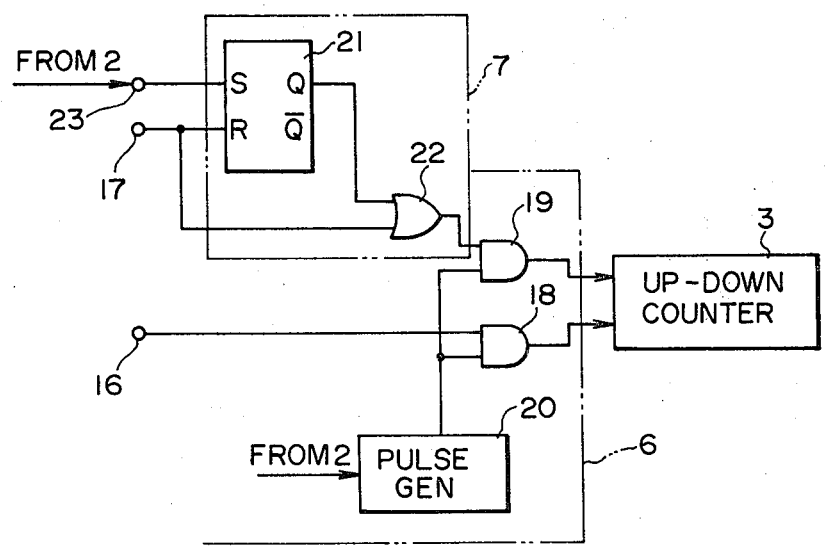
FIG. 6 is a block diagram illustrating a first embodiment of the count down circuit 7 of FIG. 5 and its connection to the automatic frequency fine control circuit 6.

An embodiment of the count down circuit 7 of FIG. 5 is illustrated in FIG. 6 and includes an R-S flip-flop 21 and an OR gate 22. When a pulse is applied to the S input terminal of the R-S flip-flop 21, from the automatic sweep control circuit 2 via terminal 23, the Q output of the flip-flop 21 is raised to a high logic level (H). When a pulse is applied to the R input terminal of the flip-flop 21, via terminal 17, the Q output is set to a low logic level (L). If the pulse is applied to the terminal 23 as the AFC circuit operation starting signal supplied by the automatic sweep control circuit 2, the output of the flip-flop 21 is raised to a high logic level (H). The Q output is applied to one of two input terminals of the OR gate 22 and the output of the OR gate 22 is raised to a high logic level (H). Therefore, even if the input applied to the terminal 17 (connected to the other input terminal of the OR gate 22) is at a low logic level (L), the up-down counter 3 is forced to perform a count down operation by the AFC circuit 6. Accordingly, even if the tuning frequency is at a point higher than the point E, it is shifted to a lower frequency. When the tuning frequency is shifted to the point E in this manner, a high logic level (H) input is applied to the terminal 17 and the flip-flop 21 is reset, so that its Q output is set to L. Then the operation of the AFC circuit 6 illustrated in FIG. 4 is carried out.

Figure 7:
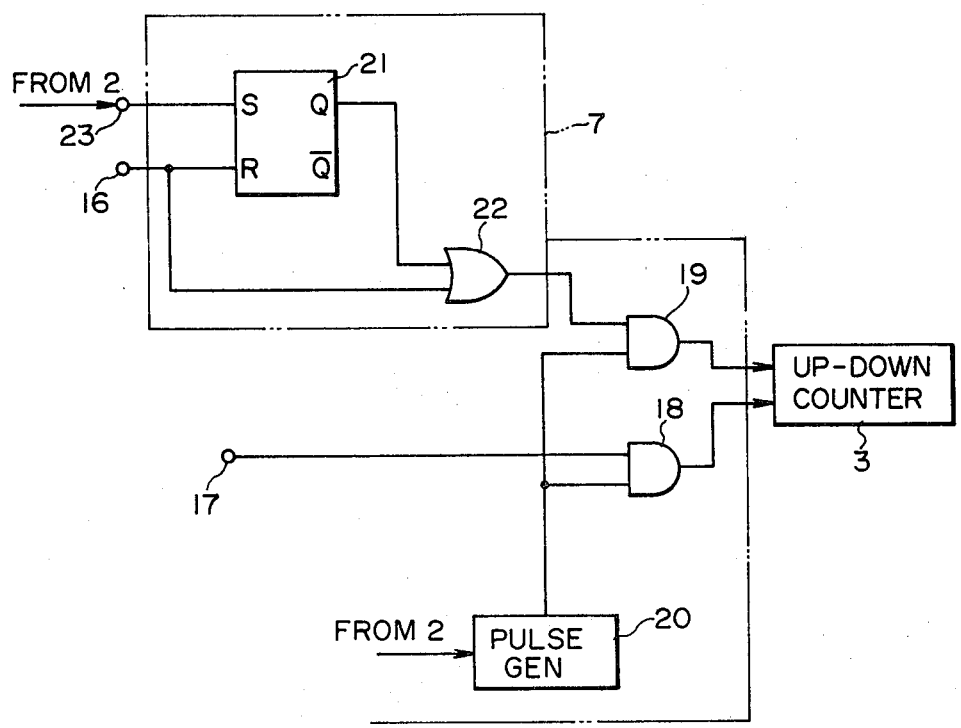
FIG. 7 is a block diagram illustrating a second embodiment of the count down circuit 7 of FIG. 5 and its connection to the automatic frequency fine control circuit 6.

FIG. 7 illustrates an alternate embodiment of the count down circuit 7, wherein when the AFC circuit operation starting signal is applied from the automatic sweep control circuit 2, the tuning frequency is shifted towards a lower frequency. In this embodiment the tuning frequency is shifted to the point B in this manner, at which time a high logic level (H) input is applied to the terminal 16. Thus, the flip-flop 21 is reset, and its Q output is set to a low logic level (L). Thereafter, the same operation as that of the AFC circuit 6 shown in FIG. 4 is carried out.

As is apparent from the above description, in the automatic sweep digital tuning circuit according to the present invention, the automatic sweep speed is not decreased, and even if the time delay of the D/A conversion is great, the tuning frequency can be shifted to a lower frequency, so that the operation of the AFC circuit 6 may be employed. In this manner, the tuning frequency may be brought to the optimum tuning point.

The many features and advantages of the invention are apparent from the detailed specification and thus it is intended by the appended claims to cover all such features and advantages of the circuit which fall within the true spirit and scope of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed is:

1. An automatic sweep digital tuning circuit operatively connected to receive a switching signal, comprising:
   an automatic sweep control circuit for receiving the switching signal and for generating a pulse signal and a fine control start signal;
   an up-down counter, operatively connected to said automatic sweep control circuit, for receiving said pulse signal and for performing a count-up operation to generate a digital output signal;
   a digital-to-analog converter, operatively connected to said up-down counter, for converting the digital output signal into an analog signal;
   an electronic tuner, operatively connected to said digital-to-analog converter and said automatic sweep control circuit, for receiving said analog signal and for providing a tuning frequency, said automatic sweep control circuit stopping the count-up operation of said up-down counter when the tuning frequency of said electronic tuner approaches a predetermined frequency;
   an automatic frequency fine control circuit, operatively connected to said electronic tuner, said automatic sweep control circuit and said up-down counter, for finely controlling the tuning frequency of said electronic tuner in dependence upon said fine control start signal, so that the tuning frequency of said electronic tuner becomes coincident with the predetermined frequency; and
   count down means, operatively connected to said automatic frequency fine control circuit and said automatic sweep control circuit, for providing a count down signal to said automatic frequency fine control circuit in dependence upon said fine control start signal, said automatic frequency fine control circuit causing said up-down counter to perform a count down operation, in dependence upon said count down signal, until the tuning frequency of said electronic tuner is an optimum frequency.

2. A circuit as set forth in claim 1, wherein said count down means comprises:
   a flip-flop operatively connected to said automatic sweep control circuit; and
   an OR gate, operatively connected to said flip-flop and said automatic frequency fine control circuit, for providing said count down signal to said automatic frequency fine control circuit.

3. A circuit as set forth in claim 2, wherein said flip-flop is an R-S flip-flop having a set input operatively connected said automatic sweep control circuit for receiving said fine control start signal, having a reset input operatively connected to said automatic frequency fine control circuit, and having an output operatively connected to said OR gate.

4. A circuit as set forth in claim 1 or 2, wherein said circuit is operatively connected to receive first and second reference voltages and wherein said automatic frequency fine control circuit comprises:
   a pulse generator for generating pulses;
   a first comparator, operatively connected to said electronic tuner and said count down means, and operatively connected to receive the first reference voltage, for comparing the output of said electronic tuner to the first reference voltage and for providing a first comparison signal to said count down means;
   a second comparator, operatively connected to said electronic tuner and operatively connected to receive the second reference voltage, for comparing the output of said electronic tuner and a second reference voltage and for generating a second comparison signal;
   a first AND gate, having a first input operatively connected to said count down means for receiving said count down signal, and having a second input operatively connected to said pulse generator, for providing a count decrease signal to said up-down counter; and
   a second AND gate, having a first input operatively connected to said first comparator for receiving said first comparison signal, and having a second input operatively connected to said pulse generator, for providing a count increase signal to said up-down counter.

5. An automatic sweep digital tuning circuit comprising:
   switching means for generating a switching signal;
   sweep means, operatively connected to said switching means, for receiving said switching signal and for generating a pulse signal and a fine control start signal;
   counter means, operatively connected to said sweep means, for receiving said pulse signal and for performing a counting operation to generate a digital output signal;
   a digital-to-analog converter, operatively connected to said counter means, for converting the digital output signal into an analog signal;
   tuner means, operatively connected to said digital to analog converter and said sweep means, for receiving said analog signal and for generating a tuning frequency signal, said sweep means selectively generating said pulse signal in dependence upon said tuning frequency signal;
   count down means, operatively connected to said sweep means, for generating a count down signal in dependence upon said fine control start signal; and
   fine control means, operatively connected to said tuner means, said count down means and said counter means, for generating a count decrease signal in dependence upon said count down signal and for generating a count increase signal in dependence upon said tuning frequency signal, said fine control means controlling the tuning frequency of said tuner means so that the tuning frequency of said tuner means becomes coincidental with an optimum frequency.

6. A circuit as set forth in claim 5, wherein said count down means comprises:
   a flip-flop operatively connected to said sweep means; and
   an OR gate, operatively connected to said flip-flop and said fine control means, for providing said count down signal to said fine control means.

7. A circuit as set forth in claim 6, wherein said fine control means is operatively connected to receive first and second reference voltages and wherein said fine control means comprises:
   a pulse generator;
   comparison means, operatively connected to said tuner means and said flip-flop, for comparing the output of said tuner means with the first and second reference voltages, for providing a first comparison signal to said flip-flop and for generating a second comparison signal;
   a first AND gate, having a first input operatively connected to said OR gate for receiving said count down signal, and having a second input operatively connected to said pulse generator, for providing said count decrease signal to said counter means; and
   a second AND gate, having a first input operatively connected to said tuner means, and having a second input operatively connected to said pulse generator, for providing said count increase signal to said counter means.

8. A circuit as set forth in claim 7, wherein said counter means comprises an up-down counter.

* * * * *

UNITED STATES PATENT AND TRADEMARK OFFICE
CERTIFICATE OF CORRECTION

PATENT NO. : 4,380,825
DATED : APRIL 19, 1983
INVENTOR(S) : HIDEHARU TAKEBE ET AL.

It is certified that error appears in the above-identified patent and that said Letters Patent is hereby corrected as shown below:

Col. 1, line 68, begin a new paragraph with "As can be seen...".
Col. 3, line 15, "increase" should be --decrease--.
Col. 4, line 30, "If" should be --After--;
line 31, after "6" insert --starts, it--;
line 32, "3," should be --3 and thus the DC voltage output from the DA converter 4, and if--;
line 33, "E and" should be --E,--;
line 61, after "to" insert --a low logic level--.
Col. 6, line 9, after "connected" insert --to--;
line 29, "and" should be --to--.

Signed and Sealed this

Thirteenth Day of September 1983

[SEAL]

Attest:

GERALD J. MOSSINGHOFF

Attesting Officer  Commissioner of Patents and Trademarks